United States Patent
Mesuda et al.

(10) Patent No.: US 12,410,101 B2
(45) Date of Patent: Sep. 9, 2025

(54) GALLIUM NITRIDE-BASED SINTERED BODY AND METHOD FOR MANUFACTURING SAME

(71) Applicant: TOSOH CORPORATION, Shunan (JP)

(72) Inventors: Masami Mesuda, Ayase (JP); Hideto Kuramochi, Ayase (JP); Yuya Tsuchida, Ayase (JP)

(73) Assignee: TOSOH CORPORATION, Shunan (JP)

( * ) Notice: Subject to any disclaimer, the term of this patent is extended or adjusted under 35 U.S.C. 154(b) by 752 days.

(21) Appl. No.: 17/283,866

(22) PCT Filed: Oct. 7, 2019

(86) PCT No.: PCT/JP2019/039438
§ 371 (c)(1),
(2) Date: Apr. 8, 2021

(87) PCT Pub. No.: WO2020/075661
PCT Pub. Date: Apr. 16, 2020

(65) Prior Publication Data
US 2021/0380488 A1    Dec. 9, 2021

(30) Foreign Application Priority Data

| Oct. 10, 2018 | (JP) | 2018-191481 |
| Oct. 26, 2018 | (JP) | 2018-201609 |
| Nov. 14, 2018 | (JP) | 2018-213668 |

(51) Int. Cl.
*C04B 35/58* (2006.01)
*C04B 35/626* (2006.01)
*C23C 14/34* (2006.01)

(52) U.S. Cl.
CPC ........ *C04B 35/58* (2013.01); *C04B 35/62645* (2013.01); *C23C 14/3414* (2013.01);
(Continued)

(58) Field of Classification Search
CPC .............. C04B 35/58; C04B 35/62645; C04B 2235/401; C04B 2235/404;
(Continued)

(56) References Cited

U.S. PATENT DOCUMENTS

| 5,942,148 A | 8/1999 | Preston |
| 10,174,419 B2 | 1/2019 | Mesuda et al. |

(Continued)

FOREIGN PATENT DOCUMENTS

| EP | 3 279 367 A1 | 2/2018 |
| JP | 3-153860 A | 7/1991 |

(Continued)

OTHER PUBLICATIONS

WO2016158651A1 machine translation (Year: 2016).*
(Continued)

*Primary Examiner* — Amber R Orlando
*Assistant Examiner* — Cameron K Miller
(74) *Attorney, Agent, or Firm* — Oblon, McClelland, Maier &Neustadt, L.L.P.

(57) ABSTRACT

The object of the present invention is to provide a large-sized gallium nitride-based sintered body having a small oxygen amount and high strength, a large-sized gallium nitride-based sintered body having a small oxygen amount and containing a dopant, to obtain a highly crystalline gallium nitride thin film which has become a n-type or p-type semiconductor by a dopant, and methods for producing them.

(Continued)

A gallium nitride-based sintered body, which has an oxygen content of at most 1 atm % and an average particle size (D50) of at least 1 μm and at most 150 μm.

25 Claims, 1 Drawing Sheet

(52) U.S. Cl.
CPC .. *C04B 2235/401* (2013.01); *C04B 2235/404* (2013.01); *C04B 2235/5436* (2013.01); *C04B 2235/5454* (2013.01); *C04B 2235/77* (2013.01)

(58) Field of Classification Search
CPC .... C04B 2235/5436; C04B 2235/5454; C04B 2235/77; C23C 14/3414
See application file for complete search history.

(56) References Cited

U.S. PATENT DOCUMENTS

| | | |
|---|---|---|
| 2003/0086856 A1 | 5/2003 | D'Evelyn et al. |
| 2008/0025902 A1* | 1/2008 | Ponce ............... C09K 11/625 75/363 |
| 2008/0193363 A1* | 8/2008 | Tsuji ................ C30B 28/06 423/409 |
| 2018/0072570 A1* | 3/2018 | Mesuda ............. C23C 14/34 |

FOREIGN PATENT DOCUMENTS

| | | | |
|---|---|---|---|
| JP | H03153860 A * | 7/1991 | |
| JP | 10-202623 A | 8/1998 | |
| JP | 11-172424 A | 6/1999 | |
| JP | 2000-313670 A | 11/2000 | |
| JP | 2001-150195 A | 6/2001 | |
| JP | 2005-508822 A | 4/2005 | |
| JP | 2012-144424 A | 8/2012 | |
| JP | 2014-91851 A | 5/2014 | |
| JP | 2014-159368 A | 9/2014 | |
| JP | 2017-24970 A | 2/2017 | |
| JP | 2018-119171 A | 8/2018 | |
| WO | WO-2016158651 A1 * | 10/2016 | ......... C01B 21/0632 |

OTHER PUBLICATIONS

JPH03153860A machine translation (Year: 1991).*
https://www.xrgraphite.com/graphite-products/graphite-dies-molds/hot-pressed-molds.html Accessed Nov. 5, 2024 Copyrighted 2010 (Year: 2010).*
https://www.mccrone.com/mm/validating-phase-quantification-of-crystalline-materials-using-x-ray-diffraction/#:~:text=Additionally%2C%20both%20methods%20are%20reasonably,10%20wt%25%20in%20a%20mixture. Accessed Nov. 5, 2024 (Year: 2024).*
Balkas, Cengiz Mustafa. Synthesis of high purity gallium nitride powders and growth and characterization of aluminum nitride and gallium nitride bulk single crystals. North Carolina State University, 1997. (Year: 1997).*
U.S. Appl. No. 15/562,112, filed Sep. 27, 2017, US 2018 /0072570 A1, Masami Mesuda, et al.
U.S. Appl. No. 16/206,346, filed Nov. 30, 2018, US 2019/0106784 A1, Masami Neesuda, et al.
Extended European Search Report issued Apr. 28, 2022 in European Patent Application No. 19870378.7, 56 pages.
Lin, K., et al., "Fabrication and Characterization of Reactively Sputtered AlInGaN Films with a Cermet Target Containing 5% Al and 7.5% In", Journal of Electronic Materials, vol. 46, No. 4, Dec. 5, 2016, XP036168892, pp. 1948-1955.
Kuo, D.-H., et al., "Characterization of quaternary Zn/Sn-codoped GaN films obtained with $Zn_xSn_{0.04}GaN$ targets at different Zn contents by the RF reactive magnetron sputtering technology", Journal of Material Science, Mar. 8, 2018, vol. 53, No. 12, XP036467681, pp. 9099-9106.
International Search Report issued on Dec. 17, 2019 in PCT/JP2019/039438 filed on Oct. 7, 2019, 2 pages.

* cited by examiner

GALLIUM NITRIDE-BASED SINTERED BODY AND METHOD FOR MANUFACTURING SAME

TECHNICAL FIELD

Gallium nitride attracts attention as a raw material of a light-emitting layer of a blue light-emitting diode (LED) or a blue laser diode (LD) and is used for various applications including white LED and blue LD in the form of a thin film or a substrate in recent years, and attracts attention also as a future material for applications including a power device. At present, a gallium nitride thin film is formed commonly by metal organic chemical vapor deposition (MOCVD) method. The MOCVD method is a method of in which crystals are grown by impregnating the carrier gas with the vapor of the raw material and transporting it to the surface of the substrate and decomposing the raw material by reacting with the heated substrate.

As a method for forming a thin film other than the MOCVD, a sputtering method may be mentioned. The sputtering method is a method in which a target placed in the cathode is physically bombarded with positive ions such as Ar ions, and by the collision energy, a material constating the target is discharged to deposit a film having a composition substantially the same as the target material on a substrate placed to face the target, and direct current (DC) sputtering method and alternating current (RF) sputtering method are mentioned.

Heretofore, to form a gallium nitride thin film by a sputtering method, a metal gallium target has been used (Patent Document 1). However, in the case of using a metal gallium target, metal gallium melts at the time of sputtering since it has a melting point of about 29.8° C., and a gallium nitride film having properties such as crystallinity and transparency highly stabilized can hardly be obtained. In order to solve such problems, a method of installing an expensive cooling device and forming a film at a lower power has been proposed, however, the productivity tends to be low and in addition, inclusion of oxygen in the film tends to increase.

Further, a high density gallium nitride sintered body has been proposed (Patent Document 2), however, according to Examples of this Patent Document, the sintered body is densified under a very high pressure of 58 Kbar (5.8 GPa), and an apparatus which applies such a pressure is very expensive and a large-sized sintered body cannot be prepared. Accordingly, a sputtering target itself to be used for the sputtering method is very expensive, and since a large-sized sintered body can hardly be prepared, the obtainable film tends to be inferior in the homogeneity.

Further, to reduce the amount of oxygen contained, a method of nitriding a gallium nitride sintered body containing oxygen to reduce the amount of oxygen has been proposed (Patent Document 3). However, if a certain or larger amount of oxygen is reduced, the sintered body may have a fracture.

Further, in the case of employing a DC sputtering method, a sputtering target is required to have a low resistivity. As the method, a method of infiltrating a gallium nitride formed product with metal gallium to reduce the resistivity of a sputtering target has been proposed (Patent Document 4). However, by such a method, although the resistivity is decreased, the metal gallium precipitates during bonding or during sputtering, and reacts with a solder material such as indium, thus leading to peeling of the gallium nitride formed product, whereby discharge cannot stably be conducted. To overcome such a problem, a method of lining the gallium nitride formed product with a tungsten thin film to prevent precipitation of the metal gallium has been proposed (Patent Document 5), however, the number of target preparation steps increases and the method becomes complicated, and it is necessary to use a special material i.e. an expensive tungsten material.

Further in recent years, formation of a gallium nitride film on a large-sized silicon substrate has been studied, and a larger-sized sputtering target will be required in future, however, such a target has not yet been present.

Further, not only blue but also green and red gallium nitride-based LEDs are required, and for that purpose, incorporation of aluminum or indium is required, however, such a sputtering target has not yet been obtained.

Further, to constitute a device, gallium nitride is required to be in n-type or p-type, however, a sputtering target which meets such requirements has not yet been obtained.

PRIOR ART DOCUMENTS

Patent Documents

Patent Document 1: JP-A-H11-172424
Patent Document 2: JP-A-2005-508822
Patent Document 3: JP-A-2012-144424
Patent Document 4: JP-A-2014-159368
Patent Document 5: JP-A-2014-91851

DISCLOSURE OF INVENTION

Problems to be Solved by the Invention

It is an object of the present invention to provide a large-sized gallium nitride-based sintered body having a small oxygen amount and high strength, a large-sized gallium nitride-based sintered body having a small oxygen amount and containing a dopant, to obtain a highly crystalline gallium nitride thin film which has become a n-type or p-type semiconductor by a dopant, and methods for producing them.

Means to Solve Problems

Under these circumstances, the present inventors have conducted extensive studies. As a result, they have found that a large-sized gallium nitride-based sintered body having a small oxygen amount and a high density can be prepared by treating a gallium nitride powder having a low oxygen content for an appropriate holding time using a hot press mold having a coefficient of thermal expansion suitable for sintering gallium nitride, and accomplished the present invention.

That is, the present invention provides the following.

(1) A gallium nitride-based sintered body, which has an oxygen content of at most 1 atm % and an average particle size (D50) of at least 1 µm and at most 150 µm.

(2) The gallium nitride-based sintered body according to (1), which contains elements Si, Ge, Sn, Pb, Be, Mg, Ca, Sr, Ba, Zn and Cd as impurities in a total amount of less than 10 wt ppm.

(3) The gallium nitride-based sintered body according to (1) or (2), which contains Mg and Si as impurities in a total amount of less than 5 wt ppm.

(4) The gallium nitride-based sintered body according to any one of (1) to (3), which contains Si as an impurity in an amount of less than 1 wt ppm.

(5) The gallium nitride-based sintered body according to (1), which has a content of at least one Group 13 element selected from the group consisting of boron, aluminum and indium of at least 0.001 atm % and at most 25 atm %.

(6) The gallium nitride-based sintered body according to (1) or (5), which contains elements Si, Ge, Sn, Pb, Be, Mg, Ca, Sr, Ba, Zn and Cd as impurities in a total amount of less than 10 wt ppm.

(7) The gallium nitride-based sintered body according to (1), (5) or (6), which contains Mg and Si as impurities in a total amount of less than 5 wt ppm.

(8) The gallium nitride-based sintered body according to any one of (1) and (5) to (7), which contains Si as an impurity in an amount of less than 1 wt ppm.

(9) The gallium nitride-based sintered body according to any one of (1) and (5) to (8), wherein in an X-ray diffraction spectrum of the sintered body, the maximum value of the peak attributable to gallium metal is at most 10% of the maximum value of the peak attributable to gallium nitride.

(10) The gallium nitride-based sintered body according to (1), which has a content of at least one dopant selected from the group consisting of Si, Ge, Sn, Pb, Be, Mg, Ca, Sr, Ba, Zn and Cd of at least 1 wt ppm and at most 100,000 wt ppm.

(11) The gallium nitride-based sintered body according to (1) or (10), wherein the dopant is at least one member selected from the group consisting of Si, Ge, Sn, Pb and Be.

(12) The gallium nitride-based sintered body according to (1), (10) or (11), wherein the dopant is at least one member selected from the group consisting of Mg, Ca, Sr, Ba, Zn and Cd.

(13) The gallium nitride-based sintered body according to any one of (1) to (12), which has a deflective strength of at least 50 MPa.

(14) The gallium nitride-based sintered body according to any one of (1) to (13), which has a density of at least 3.0 g/cm$^3$ and at most 5.4 g/cm$^3$.

(15) A method for producing the gallium nitride-based sintered body as defined in any one of (1) to (4), (13) and (14), which is a method for producing a gallium nitride-based sintered body by hot pressing, wherein a powder having an oxygen content of at most 1 atm % is used as the raw material, and the difference between the coefficient of linear thermal expansion in a direction perpendicular to the pressurization direction of the hot press mold and the coefficient of linear expansion of the raw material is within 15%.

(16) A method for producing the gallium nitride-based sintered body as defined in any one of (1), (5) to (9), (13) and (14), which is a method for producing a gallium nitride-based sintered body by hot pressing, wherein a gallium nitride powder having an oxygen content of at most 1 atm % and a powder of at least one Group 13 element selected from the group consisting of boron, aluminum and indium are used as the raw materials, and the difference between the coefficient of linear thermal expansion in a direction perpendicular to the pressurization direction of the hot press mold and the coefficient of linear expansion of the raw material is within 15%.

(17) A method for producing the gallium nitride-based sintered body as defined in any one of (1) and (10) to (14), which is a method for producing a gallium nitride-based sintered body by hot pressing, wherein a gallium nitride powder having an oxygen content of at most 1 atm % and a dopant source are used as the raw materials, and the difference between the coefficient of linear thermal expansion in a direction perpendicular to the pressurization direction of the hot press mold and the coefficient of linear expansion of the raw material is within 15%.

(18) The method for producing the gallium nitride-based sintered body according to any one of (15) to (17), wherein the hot press mold is designed to obtain a disk, and a sleeve divided into three or more pieces is used.

(19) A sputtering target, which uses the gallium nitride-based sintered body as defined in any one of (1) to (14).

(20) The sputtering target according to (19), wherein no layer containing tungsten is present between a target member and a bonding layer.

(21) A method for producing a gallium nitride-based thin film, which uses the sputtering target as defined in (19) or (20).

Advantageous Effects of Invention

The gallium nitride-based sintered body of the present invention is large-sized, has a small oxygen amount and high strength, and is suitably used as a production sputtering target and a sputtering target for LED thin film formation.

DESCRIPTION OF EMBODIMENTS

The gallium nitride-based sintered body of the present invention is a gallium nitride-based sintered body having an oxygen content of at most 1 atm % and an average particle size (D50) of at least 1 μm and at most 150 μm.

The gallium nitride-based sintered body of the present invention has an oxygen content of at most 1 atm %, preferably at most 0.5 atm %, more preferably less than 0.3 atm %, further preferably at most 0.2 atm %, still more preferably at most 0.1 atm %. By using the gallium nitride sintered body having a reduced oxygen content as a sputtering target, inclusion of oxygen as an impurity can be reduced at the time of film formation, and a film having a higher crystallinity can be obtained.

In this specification, atm % is synonymous with at %, and is represented by the ratio of the number of atoms of a specific element to the number of atoms of all the elements contained. For example, in gallium nitride containing oxygen, which contains gallium, nitrogen and oxygen in amounts represented by wt %, the oxygen content (atm %) is represented by oxygen content (atm %)=(oxygen content (wt %)/atomic weight of oxygen)/((gallium content (wt %)/atomic weight of gallium)+(nitrogen content (wt %)/atomic weight of nitrogen)+(oxygen content (wt %)/atomic weight of oxygen))

The gallium nitride-based sintered body of the present invention has an average particle size (D50) of at least 1 μm and at most 150 μm, preferably at least 5 μm and at most 100 μm, particularly preferably at least 9 μm and at most 80 μm. By such particle size, a gallium nitride-based sintered body having a smaller amount of oxygen and having high strength can be obtained. The average particle size (D50) means a 50% particle size with respect to the area of primary particles observed e.g. with a scanning electron microscope.

The gallium nitride sintered body of the present invention has a density of preferably at least 3.0 g/cm$^3$ and at most 5.4 g/cm$^3$, more preferably at least 3.5 g/cm$^3$ and at most 5.4 g/cm$^3$, particularly preferably at least 4.0 g/cm$^3$ and at most 5.4 g/cm$^3$. The density of the gallium nitride-based sintered body described here means a density including open pores. Such a gallium nitride-based sintered body can be used as a sputtering target.

The gallium nitride-based sintered body of the present invention has a deflective strength of preferably at least 50 MPa, more preferably at least 60 MPa, particularly preferably at least 70 MPa. By the sintered body having such a strength, even a large area sintered body of 150 cm$^2$ or larger can be prepared without fracture, and when such a sintered body is used as a sputtering target, it can withstand a stress applied to the sintered body in a bonding step.

The gallium nitride-based sintered body of the present invention has one of the following embodiments 1) to 3).

1) A gallium nitride-based sintered body having an oxygen content of at most 1 atm % and an average particle size (D50) of at least 1 μm and at most 150 μm, which contains elements Si, Ge, Sn, Pb, Be, Mg, Ca, Sr, Ba, Zn and Cd as impurities in a total amount of less than 10 wt ppm (gallium nitride-based sintered body A).

2) A gallium nitride-based sintered body having an oxygen content of at most 1 atm % and an average particle size (D50) of at least 1 μm and at most 150 μm, which has a content of at least one Group 13 element selected from the group consisting of boron, aluminum and indium of at least 0.001 atm % and at most 25 atm % (gallium nitride-based sintered body B).

3) A gallium nitride-based sintered body having an oxygen content of at most 1 atm % and an average particle size (D50) of at least 1 μm and at most 150 μm, which has a content of at least one dopant selected from the group consisting of Si, Ge, Sn, Pb, Be, Mg, Ca, Sr, Ba, Zn and Cd of at least 1 wt ppm and at most 100,000 wt ppm (gallium nitride-based sintered body C).

First, the gallium nitride-based sintered body A is described.

The gallium nitride-based sintered body A of the present invention contains, so as to be formed into a p-type or n-type semiconductor, elements Si, Ge, Sn, Pb, Be, Mg, Ca, Sr, Ba, Zn and Cd as impurities in a total amount of less than 10 wt ppm, preferably at most 5 wt ppm, particularly preferably at most 3 wt ppm.

Among such impurities, Mg and Si having a high activation rate, are preferably contained in a total amount of at most 5 wt ppm, more preferably at most 2 wt ppm, particularly preferably at most 1 wt ppm. Further, Si as an impurity is preferably contained in an amount of at most 1 wt ppm.

The gallium nitride-based sintered body A of the present invention preferably has an area of at least 150 cm$^2$, more preferably at least 175 cm$^2$, particularly preferably at least 200 cm$^2$. By a large-sized gallium nitride-based sintered body, the size of a substrate on which a film is formed can also be increased.

The gallium nitride-based sintered body A of the present invention may contain Al, In, or the like.

Next, the gallium nitride-based sintered body B will be described.

The gallium nitride-based sintered body B of the present invention has a total content of at least one Group 13 element selected from the group consisting of B, Al and In of at least 0.001 atm % and at most 25 atm %, preferably at least 0.01 atm % and at most 25 atm %, more preferably at least 0.1 atm % and at most 25 atm %. By the gallium nitride-based sintered body B containing B, Al and In in such a content, it can be used as a sputtering target to form a gallium nitride thin film useful as a thin film for a green or red LED or as a thin film for a power device.

The gallium nitride-based sintered body B of the present invention has an area of at least 150 cm$^2$, more preferably at least 175 cm$^2$, particularly preferably at least 200 cm$^2$. By the large-sized gallium nitride-based sintered body B, the size of a substrate on which a film is formed can also be increased.

The gallium nitride-based sintered body B of the present invention contains, so as to be formed into a p-type or n-type semiconductor, elements Si, Ge, Sn, Pb, Be, Mg, Ca, Sr, Ba, Zn and Cd as impurities in a total amount of preferably less than 10 wt ppm, more preferably at most 5 wt ppm, particularly preferably at most 3 wt ppm.

Among such impurities, Mg and Si having a high activation rate, are preferably contained in a total amount of at most 5 wt ppm, more preferably at most 2 wt ppm, particularly preferably at most 1 wt ppm. Further, Si as an impurity is preferably contained in an amount of at most 1 wt ppm.

Further, it is preferred that the amount of metal gallium is preferably small in the sintered body of the gallium nitride-based sintered body B. Particularly, in an X-ray diffraction spectrum, the maximum value of the peak attributable to gallium metal is preferably at most 10% of the maximum value of the peak attributable to gallium nitride, more preferably at most 5%, particularly preferably at most 1%. If metal gallium is present in the sintered body, it forms an alloy with the at least one Group 13 element selected from the group consisting of B, Al and In contained and lowers the melting point and makes the sintered body liquefy, whereby the sintered body may not retain its shape or may have a fracture. Further, when such a sintered body is used as a sputtering target, Ga-(B, A, In) alloy will precipitate during sputtering, and stable film formation tends to be difficult.

Finally, the gallium nitride-based sintered body C will be described.

The gallium nitride-based sintered body C of the present invention has a content of at least one dopant selected from the group consisting of Si, Ge, Sn, Pb, Be, Mg, Ca, Sr, Ba, Zn and Cd of at least 1 wt ppm and at most 100,000 wt ppm, preferably at least 3 wt ppm and at most 50,000 wt ppm. By the sintered body containing such a dopant, the gallium nitride-based thin film formed can be formed into a p-type or n-type semiconductor.

Further, in order that the gallium nitride-based sintered body C of the present invention is in a n-type semiconductor, the dopant is preferably at least one member selected from the group consisting of Si, Ge, Sn and Pb, particularly preferably Si, and in order that the gallium nitride-based sintered body C of the present invention is in a p-type semiconductor, the dopant is preferably at least one member selected from the group consisting of Be, Mg, Ca, Sr, Ba, Zn and Cd, particularly preferably Mg and/or Zn.

The gallium nitride-based sintered body C of the present invention may contain Al, In or the like other than the dopant.

Next, the method for producing the gallium nitride-based sintered body of the present invention will be described.

First, the method for producing the gallium nitride-based sintered body A according one among the embodiments of the gallium nitride-based sintered body of the present invention will be described.

In order to obtain a low-oxygen large-sized sintered body without forming cracks in the gallium nitride-based sintered body A, it is necessary to conduct sintering without applying a stress to the gallium nitride-based sintered body A as far as possible.

That is, the method for producing the gallium nitride-based sintered body A of the present invention is a method for producing a gallium nitride-based sintered body by hot pressing, wherein a powder having an oxygen content of at most 1 atm % is used as the raw material, and the difference between the coefficient of linear thermal expansion in a direction perpendicular to the pressurization direction of the hot press mold and the coefficient of linear expansion of the raw material is within 15%. By such a production method, even a large-sized sintered body of 150 cm$^2$ or larger can be produced.

First, the gallium nitride powder as the raw material is required to have an oxygen content of at most 1 atm %. The oxygen content is preferably less than 0.5 atm %, more preferably less than 0.3 atm %, further preferably at most 0.2 atm %, still more preferably at most 0.1 atm %. In order to reduce oxygen, it is necessary to suppress oxidation on the surface, and accordingly the specific surface area of the powder is preferably smaller, and is more preferably at least 0.01 m$^2$/g and at most 1.5 m$^2$/g, further preferably at least 0.01 m$^2$/g and less than 0.8 m$^2$/g. If the specific surface area is smaller than 0.01 m$^2$/g, the crystal particles are too large, and thus adhesion between particles tends to be weak, and shape retention tends to be difficult at the time of final sintering, and further, the sintering property generally decreases, whereby sintering tends to be difficult.

Further, in order to obtain the gallium nitride-based sintered body A having a sufficient strength as a sputtering target, the untamped density of the gallium nitride powder as the raw material is preferably at least 1.0 g/cm$^3$ and less than 3.0 g/cm$^3$, more preferably at least 1.4 g/cm$^3$ and less than 3.0 g/cm$^3$. The untamped density is a value obtained by filling a container having a certain volume with a powder without imparting a load such as vibration, and dividing the volume of the powder put by the volume of the container. If the untamped density is higher than 3.0 g/cm$^3$, the strength of granules constituting the powder tends to be too high, and the granules will remain uncollapsed at the time of molding and sintering, and thus the strength of the gallium nitride-based sintered body will remarkably decrease.

Further, the average particle size (D50) of the gallium nitride powder used as the raw material is preferably at least 1 μm and at most 150 μm, more preferably at least 5 μm and at most 100 μm, further preferably at least 9 μm and at most 80 μm. By using such a powder, it is possible to prepare the gallium nitride-based sintered body A which satisfies both high strength and low oxygen content. Particularly with respect to gallium nitride, the sintering starting temperature and the decomposition temperature are close to each other, the sintering temperature range is narrow and gallium nitride will not undergo significant grain growth at the time of sintering, and accordingly the distribution of the primary particles before sintering will have significant impact on the gallium nitride-based sintered body. Here, the particle size of primary particles means a diameter of a particle of the minimum unit observed with a SEM (scanning electron microscope), and the average particle size means a value as the 50% particle size measured by a diameter method after measuring at least 100 or more particles. To measure the average particle size, particle sizes of gallium nitride particles are measured. In the case of a molded product obtained by using a powder having such an average particle size, since the particle size is larger and the adhesion is smaller than ever before, if open pores are present to such an extent that the molded product can be immersed, the bonding strength between particles is relatively weak, and accordingly if the molded product is immersed with Ga, the molded product may have a fracture due to the stress generated at the time of immersion and a difference in the coefficient of thermal expansion by heating and sputtering.

Further, since the semiconductor properties may change by obtaining high crystallinity of a sputtering film and by addition of elements, it is preferred to use a gallium nitride powder containing impurities as little as possible, as the raw material. However, in order that the gallium nitride-based sintered body is formed into a p-type or n-type semiconductor, the gallium nitride powder preferably contains elements Si, Ge, Sn, Pb, Be, Mg, Ca, Sr, Ba, Zn and Cd as impurities in a total amount of less than 10 wt ppm, more preferably at most 5 wt ppm, particularly preferably at most 3 wt ppm.

Among such impurities, Mg and Si having a high activation rate are preferably contained in a total amount of at most 5 wt ppm, more preferably at most 2 wt ppm, particularly preferably 1 wt ppm. Further, Si as an impurity is preferably contained in an amount of at most 1 wt ppm.

As the sintering method, hot pressing is employed. Hot pressing is a method to make sintering proceed by imparting a temperature while pressurizing the powder, and is a sintering method by which diffusion at the time of sintering is assisted by conducting uniaxial pressing at the time of heating, whereby a material which has a low diffusion coefficient and which is hardly sintered can be sintered.

The difference between the coefficient of linear thermal expansion in a direction perpendicular to the pressurization direction of the hot press mold and the coefficient of thermal expansion of the raw material charged is preferably within 15%, more preferably within 10%, further preferably within 5%. It is still more preferably at most +1% and at least −5% relative to the coefficient of thermal expansion of the raw material. The coefficient of linear thermal expansion of the hot press mold means a value with respect to the mold shown in FIG. 1. In a case where the gallium nitride-based sintered body A is to be prepared, the coefficient of linear thermal expansion of the hot press mold is preferably at least 5.0×10$^{-6}$1 K and at most 7.0×10$^{-6}$1 K, more preferably at least 5.0×10$^{-6}$/K and at most 6.0×10$^{-6}$/K. By using a material having a coefficient of thermal expansion within such a range, the coefficient of thermal expansion of the material is close to the coefficient of linear thermal expansion of gallium nitride, and a stress applied to a large-sized sintered body can be reduced. When the sintered body is small-sized, even though there is a difference in the coefficient of linear thermal expansion, sintering is possible since the difference in dimensions is small, however, fine cracks are included in the sintered body, thus lowering the strength. When the area of the sintered body is 150 cm$^2$ or larger, the difference in dimensions by the difference in the thermal expansion tends to be large, and a stress will be applied during sintering, and the sintered body will have a fracture. Specifically, if the coefficient of linear thermal expansion of the hot press mold is at most 5.0×10$^{-6}$1 K, at the time of pressure sintering at a predetermined temperature and lowering the temperature, shrinkage of the hot press mold is smaller than shrinkage of the gallium nitride-based sintered body A, whereby a large tensile stress will occur, and the gallium nitride-based sintered body A will have a fracture. On the other hand, if the coefficient of linear thermal expansion of the hot press mold is at least 7.0×10$^{-6}$1 K, at the time of lowering the temperature, shrinkage of the hot press mold is larger than shrinkage of the gallium nitride-based sintered body A, a compression stress from outside will occur, whereby the gallium nitride-based sintered body A will have lowered strength or will have a fracture due to formation of cracks.

Figure 1:
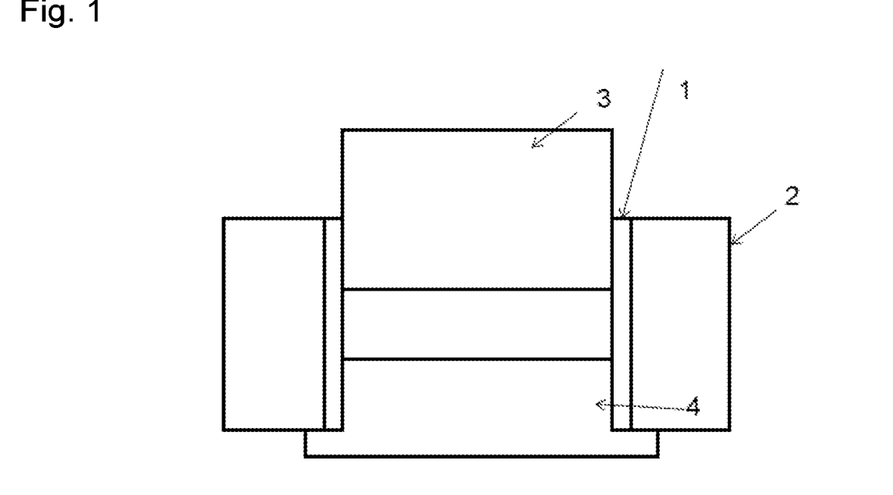
FIG. 1 illustrates a hot press mold used in Examples and Comparative Examples.

An example of the hot press mold is shown in FIG. 1. In this drawing, the materials of the die, the upper punch, the lower punch and the sleeve are preferably the same. By the members made of the same material, volume change at the time of heating will be uniform, and stresses at the time of thermal expansion and shrinkage can be reduced.

The sintering temperature is at least 1,060° C. and less than 1,200° C. A temperature of at least 1,060° C. is required to make sintering of gallium nitride proceed, and the temperature should be less than 1,200° C. so as to suppress decomposition of gallium nitride into nitrogen and metal gallium to a certain level or lower. Further, in order to improve the density of the gallium nitride-based sintered body A, the pressure at the time of sintering is preferably at least 30 MPa and at most 100 MPa, more preferably at least 40 MPa and at most 90 MPa.

The sintering temperature depends on the particle size of the powder used, and the larger the particle size is, the higher the sintering temperature can be.

The holding time at the time of sintering is preferably at least 2 hours and at most 5 hours, more preferably at least 3 hours and at most 4 hours. If it is less than 2 hours, even though the density is increased by partial decomposition of gallium, adhesion between particles will not proceed. If the sintering time is longer than 5 hours, decomposition will proceed, whereby fine particles will no longer be present, and the strength cannot be maintained even if the density is improved. By sintering for time within such a range, decomposition can be suppressed while sintering is made to proceed, whereby the gallium nitride-based sintered body A having strength higher than ever can be obtained.

Hot pressing is conducted in vacuum. The degree of vacuum at the start of heating is at most 10 Pa, preferably at most $1 \times 10^{-1}$ Pa, more preferably $5 \times 10^{-2}$ Pa, particularly preferably at most $1 \times 10^{-2}$ Pa, whereby it is possible to reduce oxygen elements such as oxygen and water mixed in from the atmosphere and suppress oxidation during sintering.

Further, in the case of sintering in vacuum, decomposition of the gallium nitride powder gradually proceeds from around 1,060° C., and by sintering in vacuum, a part of metal gallium which is formed by decomposition will be discharged from the gallium nitride-based sintered body to the outside together with nitrogen of a decomposition gas. Accordingly, in a hot press mold, clearance between the die and the upper punch is preferably at least 0.2 mm. Otherwise, it is preferred to interpose a material with a low density such as a carbon felt between the powder and the upper and lower punches.

Figure 2:
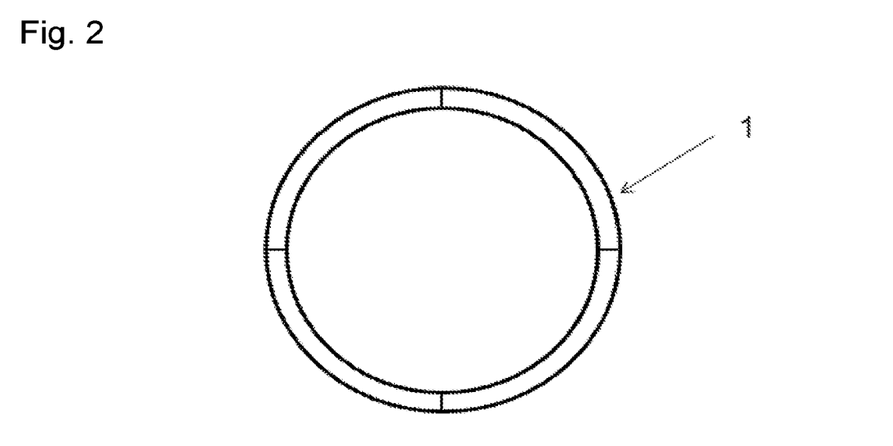
FIG. 2 illustrates a sleeve divided into four pieces used in Examples.

The hot press mold preferably has a sleeve 1 divided into pieces. More preferably, the sleeve is divided into three or more pieces, further preferably four or more pieces. The maximum number of pieces is preferably at most 6. By using a sleeve divided in such a manner, the gallium nitride-based sintered body A will readily be taken out, and fracture and chipping can be prevented.

Further, in order to reduce oxygen adsorbed in the hot press mold, it is preferred to bake the hot press mold in the air once before sintering, whereby moisture adsorbed in a hot press apparatus or the mold can be reduced before sintering.

By hot pressing under the above conditions, metal gallium will not be an inhibitor at the time of sintering and is contained in an appropriate amount, and thus sintering will proceed, whereby the gallium nitride-based sintered body A which has a high density and of which oxidation is suppressed can be obtained. Particularly in a temperature region of at least 1,090° C. and at most 1,150° C., although metal gallium is partially decomposed, sintering of gallium nitride also proceeds, and accordingly by conducting pressure sintering in high vacuum, sintering of gallium nitride will proceed without being inhibited by metal gallium, whereby the density will improve. In a case where gallium nitride is used as a sputtering target, the gallium nitride-based sintered body A preferably has electrical conductivity and for that purpose, metal gallium is preferably present. And, since gallium forms an alloy with various metals to lower the melting point, by partially decomposing and precipitating gallium, impurity elements remaining in the interior of the sintered body can be discharged together with metal gallium, and the gallium nitride-based sintered body A containing impurities as little as possible is obtained.

The gallium nitride-based sintered body A to be obtained is preferably in the form of a disk. By the sintered body A being in a disk form, the thermal expansion/shrinkage is uniform in the circumferential direction, and it is possible to suppress a stress applied to the gallium nitride-based sintered body A.

The obtained gallium nitride-based sintered body A may be processed into predetermined dimensions depending upon the application such as a sputtering target. The processing method is not particularly limited, and may, for example, be surface grinding, rotary grinding or cylindrical grinding.

Next, the method for producing the gallium nitride-based sintered body B according one among the embodiments of the gallium nitride-based sintered body of the present invention will be described.

In order to obtain a low-oxygen large-sized sintered body without forming cracks in the gallium nitride-based sintered body B, it is necessary to conduct sintering without applying a stress to the gallium nitride-based sintered body B as far as possible.

That is, the method for producing the gallium nitride-based sintered body B of the present invention is a method for producing a gallium nitride-based sintered body by hot pressing, wherein a gallium nitride powder having an oxygen content of at most 1 atm % and a powder of at least one Group 13 element selected from the group consisting of boron, aluminum and indium are used as the raw materials, and the difference between the coefficient of linear thermal expansion in a direction perpendicular to the pressurization direction of the hot press mold and the coefficient of linear expansion of the raw material is within 15%.

First, the gallium nitride powder as the raw material is required to have an oxygen content of at most 1 atm %. The oxygen content is more preferably less than 0.5 atm %, more preferably less than 0.3 atm %, further preferably at most 0.2 atm %, still more preferably at most 0.1 atm %. In order to reduce oxygen, it is necessary to suppress oxidation on the surface, and accordingly the specific surface area of the powder is preferably smaller, and is more preferably at least 0.01 $m^2/g$ and at most 1.5 $m^2/g$, further preferably at least 0.01 $m^2/g$ and less than 0.8 $m^2/g$. If the specific surface area is smaller than 0.01 $m^2/g$, the crystal particles are too large, and thus adhesion between particles tends to be weak, and shape retention tends to be difficult at the time of final sintering and further, the sintering property generally decreases, whereby sintering tends to be difficult.

Further, in order to obtain the gallium nitride-based sintered body B having a sufficient strength as a sputtering target, the untamped density of the gallium nitride powder as the raw material is preferably at least 1.0 g/cm³ and less than 3.0 g/cm³, more preferably at least 1.4 g/cm³ and less than 3.0 g/cm³. The untamped density is a value obtained by filling a container having a certain volume with a powder without imparting a load such as vibration, and dividing the volume of the powder put by the volume of the container. If the untamped density is higher than 3.0 g/cm³, the strength of granules constituting the powder tends to be too high, and the granules will remain uncollapsed at the time of molding and sintering, and thus the strength of the gallium nitride-based sintered body will remarkably decrease.

Further, the average particle size (D50) of the gallium nitride powder used as the raw material is preferably at least 1 μm and at most 150 μm, more preferably at least 5 μm and at most 100 μm, further preferably at least 9 μm and at most 80 μm. By using such a powder, it is possible to prepare the gallium nitride-based sintered body B which satisfies both high strength and low oxygen content. Particularly with respect to gallium nitride, the sintering starting temperature and the decomposition temperature are close to each other, the sintering temperature range is narrow and gallium nitride will not undergo significant grain growth at the time of sintering, and accordingly the distribution of the primary particles before sintering will have significant impact on the gallium nitride-based sintered body B. Here, the particle size of primary particles means a diameter of a particle of the minimum unit observed with a SEM, and the average particle size means a value as the 50% particle size measured by a diameter method after measuring at least 100 or more particles. To measure the average particle size, particle sizes of gallium nitride particles are measured. In the case of a molded product obtained by using a powder having such an average particle size, since the particle size is larger and the adhesion is smaller than ever before, if open pores are present to such an extent that the molded product can be immersed, the bonding strength between particles is relatively weak, and accordingly if the molded product is immersed with gallium, the molded product may have a fracture due to the stress generated at the time of immersion and a difference in the coefficient of thermal expansion by heating and sputtering.

Further, since the semiconductor properties may change by obtaining high crystallinity of a sputtering film and by addition of elements, it is preferred to use a gallium nitride powder containing impurities as little as possible, as the raw material. However, in order that the gallium nitride-based sintered body is formed into a p-type or n-type semiconductor, the gallium nitride powder preferably contains elements Si, Ge, Sn, Pb, Be, Mg, Ca, Sr, Ba, Zn and Cd as impurities in a total amount of less than 10 wt ppm, more preferably at most 5 wt ppm, particularly preferably at most 3 wt ppm.

Among such impurities, Mg and Si having a high activation rate are preferably contained in a total amount of at most 5 wt ppm, more preferably at most 2 wt ppm, particularly preferably 1 wt ppm. Further, Si as an impurity is preferably contained in an amount of at most 1 wt ppm.

With respect to boron, aluminum and indium to be contained also, it is preferred to use one containing impurities as little as possible. The purity is, relating to the metal impurities, preferably at least 99 wt %, more preferably at least 99.9 wt %.

The form of boron, aluminum and indium to be contained is not particularly limited, and since it is preferred not to contain oxygen as far as possible and not to contain other metal element, metal born, boron nitride, metal aluminum, aluminum nitride, metal indium or indium nitride is preferred, and metal aluminum, aluminum nitride, metal indium or indium nitride is more preferred. The amount of oxygen contained in the raw material is preferably at most 3 atm %, more preferably at most 1.5 atm %, further preferably at most 1 atm %. In such a manner, the gallium nitride-based sintered body B having an oxygen amount suppressed can be obtained.

As the sintering method, hot pressing is employed. Hot pressing is a method to make sintering proceed by imparting a temperature while pressurizing the powder, and is a sintering method by which diffusion at the time of sintering is assisted by conducting uniaxial pressing at the time of heating, whereby a material which has a low diffusion coefficient and which is hardly sintered can be sintered.

The difference between the coefficient of linear thermal expansion in a direction perpendicular to the pressurization direction of the hot press mold and the coefficient of thermal expansion of the raw material charged is preferably within 15%, more preferably within 10%, further preferably within 5%. It is still more preferably at most +1% and at least −5% relative to the coefficient of thermal expansion of the raw material. The coefficient of linear thermal expansion of the hot press mold means a value with respect to the mold shown in FIG. 1. In a case where the gallium nitride-based sintered body B is to be prepared, the coefficient of linear thermal expansion of the hot press mold is preferably at least $5.0 \times 10^{-6}$/K and at most $7.0 \times 10^{-6}$/K, more preferably at least $5.0 \times 10^{-6}$/K and at most $6.0 \times 10^{-6}$/K. By using a material having a coefficient of thermal expansion within such a range, the coefficient of thermal expansion of the material is close to the coefficient of linear thermal expansion of gallium nitride, and a stress applied to a large-sized sintered body can be reduced. When the sintered body is small-sized, even though there is a difference in the coefficient of linear thermal expansion, sintering is possible since the difference in dimensions is small, however, fine cracks are included in the sintered body, thus lowering the strength. When the area of the sintered body is 150 cm² or larger, the difference in dimensions by the difference in the thermal expansion tends to be large, and a stress will be applied during sintering, and the sintered body will have a fracture. Specifically, if the coefficient of linear thermal expansion of the hot press mold is at most $5.0 \times 10^{-6}$/K, at the time of pressure sintering at a predetermined temperature and lowering the temperature, shrinkage of the hot press mold is smaller than shrinkage of the gallium nitride-based sintered body B, whereby a large tensile stress will occur, and the gallium nitride-based sintered body B will have a fracture. On the other hand, if the coefficient of linear thermal expansion of the hot press mold is at least $7.0 \times 10^{-6}$/K, at the time of lowering the temperature, shrinkage of the hot press mold is larger than shrinkage of the gallium nitride-based sintered body B, a compression stress from outside will occur, whereby the gallium nitride-based sintered body B will have lowered strength or will have a fracture due to formation of cracks.

An example of the hot press mold is shown in FIG. 1. In this drawing, the materials of the die, the upper punch, the lower punch and the sleeve are preferably the same. By the members made of the same material, volume change at the time of heating will be uniform, and stresses at the time of thermal expansion and shrinkage can be reduced.

The sintering temperature is at least 1,060° C. and less than 1,200° C. A temperature of at least 1,060° C. is required to make sintering of gallium nitride proceed, and the temperature should be less than 1,200° C. so as to suppress decomposition of gallium nitride into nitrogen and metal gallium to a certain level or lower. Further, in order to improve the density of the gallium nitride-based sintered body B, the pressure at the time of sintering is preferably at least 30 MPa and at most 100 MPa, more preferably at least 40 MPa and at most 90 MPa.

The sintering temperature depends on the particle size of the powder used, and the larger the particle size is, the higher the sintering temperature can be.

The holding time at the time of sintering is preferably at least 15 minutes and less than 1 hour. If it is less than 15 minutes, even though the density is increased by partial decomposition of gallium, adhesion between particles will not proceed. If the sintering time is longer than 1 hour, decomposition will proceed, whereby gallium will form an alloy with boron, aluminum and indium contained, thus lowering the melting point, whereby the strength cannot be maintained even if the density is improved. By sintering for time within such a range, decomposition can be suppressed while sintering is made to proceed, whereby the gallium nitride-based sintered body B having strength higher than ever can be obtained.

Hot pressing is conducted in vacuum. The degree of vacuum at the start of heating is at most 10 Pa, preferably at most $1 \times 10^{-1}$ Pa, more preferably $5 \times 10^{-2}$ Pa, particularly preferably at most $1 \times 10^{-2}$ Pa, whereby it is possible to reduce oxygen elements such as oxygen and water mixed in from the atmosphere and suppress oxidation during sintering.

Further, in the case of sintering in vacuum, decomposition of the gallium nitride powder gradually proceeds from around 1,060° C., and by sintering in vacuum, a part of metal gallium which is formed by decomposition will be discharged from the gallium nitride-based sintered body B to the outside together with nitrogen of a decomposition gas. Accordingly, in a hot press mold, clearance between the die and the upper punch is preferably at least 0.2 mm. Otherwise, it is preferred to interpose a material with a low density such as a carbon felt between the powder and the upper and lower punches.

The hot press mold preferably has a sleeve divided into pieces. More preferably, the sleeve is divided into three or more pieces, further preferably four or more pieces. The maximum number of pieces is preferably at most 6. By using a sleeve divided in such a manner, the gallium nitride-based sintered body B will readily be taken out, and fracture and chipping can be prevented.

Further, in order to reduce oxygen adsorbed in the hot press mold, it is preferred to bake the hot press mold in the air once before sintering, whereby moisture adsorbed in a hot press apparatus or the mold can be reduced before sintering.

The gallium nitride-based sintered body B to be obtained is preferably in the form of a disk. By the sintered body B being in a disk form, the thermal expansion/shrinkage is uniform in the circumferential direction, and it is possible to suppress a stress applied to the gallium nitride-based sintered body B.

The obtained gallium nitride-based sintered body B may be processed into predetermined dimensions depending upon the application such as a sputtering target. The processing method is not particularly limited, and may, for example, be surface grinding, rotary grinding or cylindrical grinding.

Finally, the method for producing the gallium nitride-based sintered body C according one among the embodiments of the gallium nitride-based sintered body of the present invention will be described.

The method for producing the gallium nitride-based sintered body C of the present invention is a method for producing a gallium nitride-based sintered body, wherein a gallium nitride powder having an oxygen content of at most 1 atm % and a dopant source are used as the raw materials, and the difference between the coefficient of linear thermal expansion in a direction perpendicular to the pressurization direction of the hot press mold and the coefficient of linear expansion of the raw material is within 15%.

In order to obtain a low-oxygen gallium nitride-based sintered body C without forming cracks in the sintered body, it is necessary to conduct sintering without applying a stress to the gallium nitride-based sintered body C as far as possible. That is, the production method of the present invention is a method for producing a gallium nitride-based sintered body by hot pressing, wherein a gallium nitride powder having an oxygen content of at most 1 atm % and a dopant source as the raw materials, and the difference between the coefficient of linear thermal expansion in a direction perpendicular to the pressurization direction of the hot press mold and the coefficient of linear expansion of the raw material is within 15%. By such a production method, even the gallium nitride-based sintered body C containing a dopant can be produced.

First, the gallium nitride powder as the raw material is required to have an oxygen content of at most 1 atm %. The oxygen content is preferably less than 0.5 atm %, more preferably at most 0.3 atm %, further preferably at most 0.2 atm %, still more preferably at most 0.1 atm %. In order to reduce oxygen, it is necessary to suppress oxidation on the surface, and accordingly the specific surface area of the powder is preferably smaller, and is more preferably at least 0.01 m$^2$/g and at most 1.5 m$^2$/g, further preferably at least 0.01 m$^2$/g and less than 0.8 m$^2$/g. By using such a powder, the amount of oxygen included from the powder can be reduced. If the specific surface area is smaller than 0.01 m$^2$/g, the crystal particles are too large, and thus adhesion between particles tends to be weak, and shape retention tends to be difficult at the time of final sintering, and further, the sintering property generally decreases, whereby sintering tends to be difficult.

Further, in order to obtain the gallium nitride-based sintered body C having a sufficient strength as a sputtering target, the untamped density of the gallium nitride powder as the raw material is preferably at least 1.0 g/cm$^3$ and less than 3.0 g/cm$^3$, more preferably at least 1.4 g/cm$^3$ and less than 3.0 g/cm$^3$. The untamped density is a value obtained by filling a container having a certain volume with a powder without imparting a load such as vibration, and dividing the volume of the powder put by the volume of the container. If the untamped density is higher than 3.0 g/cm$^3$, the strength of granules constituting the powder tends to be too high, and the granules will remain uncollapsed at the time of molding and sintering, and thus the strength of the gallium nitride-based sintered body C will remarkably decrease.

Further, the average particle size (D50) of the gallium nitride powder used as the raw material is preferably at least 1 μm and at most 150 μm, more preferably at least 5 μm and at most 100 μm, further preferably at least 9 μm and at most 80 μm. By using such a powder, it is possible to prepare the gallium nitride-based sintered body C which satisfies both sintering property and low oxygen content. Particularly with respect to gallium nitride, the sintering starting temperature and the decomposition temperature are close to each other, the sintering temperature range is narrow and gallium nitride will not undergo significant grain growth at the time of sintering, and accordingly the distribution of the primary particles before sintering will have significant impact on the gallium nitride-based sintered body C. Here, the particle size of a primary particle means a diameter of a particle of the minimum unit observed with a SEM, and the average particle size means a value as the 50% particle size measured by a diameter method after measuring at least 100 or more particles. To measure the average particle size, particles sizes of gallium nitride particles are measured. In the case of a molded product obtained by using a powder having such an average particle size, since the particle size is larger and the adhesion is smaller than ever before, if open pores are present to such an extent that the molded product can be immersed, the bonding strength between particles is relatively weak, and accordingly if the molded product is immersed with Ga, the molded product may have a fracture due to the stress generated at the time of immersion and a difference in the coefficient of thermal expansion by heating and sputtering.

Further, since the semiconductor properties may change by obtaining high crystallinity of a sputtering film and by addition of elements, it is preferred to use a gallium nitride powder containing impurities as little as possible, as the raw material.

The dopant source is not particularly limited, and since it is preferred not to include oxygen and not to contain other impurities, a nitride or an alloy with gallium is preferred. The nitride may, for example, be silicon nitride, germanium nitride, tin nitride, beryllium nitride, magnesium nitride, calcium nitride, strontium nitride, zinc nitride or cadmium nitride, and the alloy with gallium may, for example, be gallium/magnesium alloy.

In order that the gallium nitride-based sintered body C of the present invention is formed into a n-type semiconductor, the dopant source is preferably at least one member selected from the group consisting of silicon nitride, germanium nitride and tin nitride, particularly preferably silicon nitride, and in order that the gallium nitride-based sintered body C of the present invention is formed into a p-type semiconductor, the dopant source is preferably at least one member selected from the group consisting of beryllium nitride, magnesium nitride, gallium/magnesium alloy, calcium nitride, strontium nitride, zinc nitride and cadmium nitride, particularly preferably magnesium nitride and/or zinc nitride.

Further, the particle size of the dopant source is, in order to satisfy both low oxygen content and high dispersibility, preferably at least 1/10 and at most 10 times the average particle size of the gallium nitride powder. Within such a range, the elements contained can be highly dispersed without increasing oxygen.

As the sintering method, hot pressing is employed. Hot pressing is a method to make sintering proceed by imparting a temperature while pressurizing the powder, and is a sintering method by which diffusion at the time of sintering is assisted by conducting uniaxial pressing at the time of heating, whereby a material which has a low diffusion coefficient and which is hardly sintered can be sintered.

The difference between the coefficient of linear thermal expansion in a direction perpendicular to the pressurization direction of the hot press mold and the coefficient of thermal expansion of the raw material charged is preferably within 15%, more preferably within 10%, further preferably within 5%. It is still more preferably at most +0.1% and at least −0.5% relative to the coefficient of thermal expansion of the raw material. In the case of gallium nitride, the coefficient of linear thermal expansion of the hot press mold is preferably at least $5.0\times10^{-6}$/K and at most $7.0\times10^{-6}$/K, more preferably at least $5.0\times10^{-6}$/K and at most $6.0\times10^{-6}$/K. By using a material having a coefficient of thermal expansion within such a range, the coefficient of thermal expansion of the material is close to the coefficient of linear thermal expansion of gallium nitride, and a stress applied to a large-sized sintered body can be reduced. When the sintered body is small-sized, even though there is a difference in the coefficient of linear thermal expansion, sintering is possible since the difference in dimensions is small, however, fine cracks are included in the sintered body, thus lowering the strength. When the area of the sintered body is 150 cm$^2$ or larger, the difference in dimensions by the difference in the thermal expansion tends to be large, and a stress will be applied during sintering, and the sintered body will have a fracture. Specifically, if the coefficient of linear thermal expansion of the hot press mold is at most $5.0\times10^{-6}$/K, at the time of pressure sintering at a predetermined temperature and lowering the temperature, shrinkage of the hot press mold is smaller than shrinkage of the gallium nitride-based sintered body C, whereby a large tensile stress will occur, and the gallium nitride-based sintered body C will have a fracture. On the other hand, if the coefficient of linear thermal expansion of the hot press mold is at least $7.0\times10^{-6}$/K, at the time of lowering the temperature, shrinkage of the hot press mold is larger than shrinkage of the gallium nitride-based sintered body C, a compression stress from outside will occur, whereby the gallium nitride-based sintered body C will have lowered strength or will have a fracture due to formation of cracks.

The sintering temperature is at least 1,060° C. and less than 1,200° C. A temperature of at least 1,060° C. is required to make sintering of gallium nitride proceed, and the temperature should be less than 1,200° C. so as to suppress decomposition of gallium nitride into nitrogen and metal gallium to a certain level or lower. Further, in order to improve the density of the gallium nitride-based sintered body C, the pressure at the time of sintering is preferably at least 30 MPa and at most 100 MPa, more preferably at least 40 MPa and at most 90 MPa.

The sintering temperature depends on the particle size of the powder used, and the larger the particle size is, the higher the sintering temperature can be.

The holding time at the time of sintering is preferably at least 2 hours and at most 5 hours, more preferably at least 3 hours and at most 4 hours. If it is less than 2 hours, even though the density is increased by partial decomposition of gallium, adhesion between particles will not proceed. If the sintering time is longer than 5 hours, decomposition will proceed, whereby fine particles will no longer be present, and the strength cannot be maintained even if the density is improved. By sintering for time within such a range, decomposition can be suppressed while sintering is made to proceed, whereby the gallium nitride-based sintered body C having strength higher than ever can be obtained.

Hot pressing is conducted in vacuum. The degree of vacuum at the start of heating is at most 10 Pa, preferably at most $1\times10^{-1}$ Pa, more preferably $5\times10^{-2}$ Pa, particularly preferably at most $1\times10^{-2}$ Pa, whereby it is possible to reduce oxygen elements such as oxygen and water mixed in from the atmosphere and suppress oxidation during sintering.

Further, in the case of sintering in vacuum, decomposition of the gallium nitride powder gradually proceeds from around 1,060° C., and by sintering in vacuum, a part of metal gallium which is formed by decomposition will be discharged from the gallium nitride-based sintered body C to the outside together with nitrogen of a decomposition gas.

Accordingly, in a hot press mold, clearance between the die and the upper punch is preferably at least 0.2 mm. Otherwise, it is preferred to interpose a material with a low density such as a carbon felt between the powder and the upper and lower punches.

The hot press mold preferably has a sleeve 1 divided into pieces. More preferably, the sleeve is divided into three or more pieces, further four or more pieces. The maximum number of pieces is preferably at most 6. By dividing the sleeve in such a manner, the gallium nitride-based sintered body C will readily be taken out, and fracture and chipping can be prevented.

Further, in order to reduce oxygen adsorbed in the mold, it is preferred to bake the hot press mold in the air once before sintering, whereby moisture adsorbed in a hot press apparatus or the mold can be reduced before sintering.

By hot pressing under the above conditions, metal gallium will not be an inhibitor at the time of sintering and is contained in an appropriate amount, and thus sintering will proceed, whereby the gallium nitride-based sintered body C which has a high density and of which oxidation is suppressed can be obtained. Particularly in a temperature region of at least 1,090° C. and at most 1,150° C., although metal gallium is partially decomposed, sintering of gallium nitride also proceeds, and accordingly by conducting pressure sintering in high vacuum, sintering of gallium nitride will proceed without being inhibited by metal gallium, whereby the density will improve. In a case where gallium nitride is used as a sputtering target, the gallium nitride-based sintered body C preferably has electrical conductivity and for that purpose, metal gallium is preferably present.

The gallium nitride-based sintered body C to be obtained is preferably in the form of a disk. By the sintered body C being in a disk form, the thermal expansion/shrinkage is uniform in the circumferential direction, and it is possible to suppress a stress applied to the gallium nitride-based sintered body C.

The obtained gallium nitride-based sintered body C may be processed into predetermined dimensions depending upon the application such as a sputtering target. The processing method is not particularly limited, and may, for example, be surface grinding, rotary grinding or cylindrical grinding.

The gallium nitride-based sintered body may be fixed (bonded) to a support in a flat plate shape or in a cylindrical shape by an adhesive such as a solder material, if necessary, and may be used as a sputtering target. As the sputtering target, it is preferred that no layer containing tungsten is present between a target member and a bonding layer. By not using an expensive metal tungsten target, the cost is reduced, and the productivity will improve since a step of forming a tungsten film is unnecessary.

Further, for the sputtering target of the present invention, it is preferred to use as a bonding layer a tin-based solder material, an indium-based solder material or a zinc-based solder material. Among them, indium solder is preferred which has particularly high electrical conductivity and thermal conductivity and which is soft and is thereby easily deformed.

Further, for the sputtering target of the present invention, as the support, a metal such as Cu, SUS or Ti, which has a high thermal conductivity and high strength is preferred. As the shape of the support, it is preferred to use a support in a flat plate shape for a formed product in a flat plate shape, and a support in a cylindrical shape for a formed product in a cylindrical shape.

Next, the method for producing a sputtering target of the present invention will be described.

The sputtering target of the present invention is produced by bonding the gallium nitride-based sintered body to the support via a bonding layer. As the bonding layer, a tin-based solder material, an indium-based solder material, a zinc-based solder material or the like may be used, and in a case where an indium-based solder material is used, so as to improve indium wettability to the gallium nitride-based sintered body, a layer improving wettability may be formed between the gallium nitride-based sintered body and the solder material. The material of such a layer is preferably one which is available at a low cost and which has high wettability to indium, for example, a nickel-based or chromium-based material. Such a layer is preferably uniformly formed over the entire interface with the solder material. A method of forming such a barrier layer is not particularly limited, and sputtering, deposition or coating may, for example, be mentioned.

EXAMPLES

Hereinafter, the present invention will be described with reference to Examples, however, the present invention is not limited thereto.
(Untamped Density)
The untamped density was measured by Powder Characteristics Tester PT-N (manufactured by HOSOKAWA MICRON CORPORATION).
(Density of Gallium Nitride-Based Sintered Body)
The density of the gallium nitride-based sintered body was measured in accordance with bulk density measurement in JIS R1634.
(Oxygen Content)
The oxygen content was measured by oxygen/nitrogen analysis apparatus (manufactured by LECO JAPAN CORPORATION).
(Measurement of Average Particle Size (D50))
With respect to the average particle size (D50), the particle sizes of at least 100 particles were measured from at least three fields of view by the diameter method from images observed with a SEM, and the 50% particle size was taken as the average particle size. The objects to be measured were only the gallium nitride powder and the gallium nitride particles in the gallium nitride sintered body.
(Deflective Strength)
The deflective strength of the sintered body was measured in accordance with JIS R-1601 with respect to a sample processed into appropriate dimensions.
(Analysis of Impurities)
Impurities other than gas components were analyzed by GDMS (glow discharge mass spectrometry).
(Confirmation of Crystal Phase, Method of Measuring Intensity Ratio)
For usual measurement, a common powder X-ray diffraction apparatus (apparatus name: Ultima III, manufactured by Rigaku Corporation) was used. The XRD measurement conditions are as follows.
Light source: CuKα ray ($\lambda$=0.15418 nm)
Measurement mode: 2θ/θ scan
Measurement interval: 0.01°
Divergence slit: 0.5 deg
Scattering slit: 0.5 deg
Receiving slit: 0.3 mm
Measurement time: 1.0 second
Measurement range: 2θ=20° to 80°

To identify the XRD pattern, a XRD analysis software (product name: JADE7, manufactured by Materials Data Incorporated) was used. With respect to the hexagonal crystal, a gallium nitride crystal phase was confirmed with reference to JCPDS No. 00-050-0792, and with respect to metal gallium, for example, with reference to JCPDS NO. 00-005-0601, the ratio of highest peaks was confirmed.

Peak intensity ratio=maximum peak intensity of metal gallium/maximum peak intensity of gallium nitride (Dopant Content Measurement)

The dopant content was measured by ICP-AES, and in the case of detection limit or lower by ICP-AES, it was measured by GDMS (glow discharge mass spectrometry).

Examples 1 to 7

600 g of a gallium nitride powder as identified in Table 1 was cast in a carbon mold of 180 mm in diameter, with a coefficient of thermal expansion of the die as identified in Table 1, and the mold was put in a hot press. Sintering was started with an ultimate vacuum before the start of temperature increase as identified in Table 2, the temperature was increased at 200° C./h finally to the temperature as identified in Table 1, and on that occasion, the pressure was elevated to the pressure as identified in Table 1 when the maximum temperature was kept, and hot pressing was conducted for a holding time of 2 hours at the maximum temperature under the corresponding pressure. The temperature was decreased to about 50° C. over a period of 5 hours, the mold was taken out, and the sintered body was recovered. The sintered body was at least 150 cm$^2$ in each Example. Of the obtained gallium nitride-based sintered body, the density, the average particle size (D50), the oxygen content, the deflective strength and the area are shown in Table 3.

Further, the amounts of impurities in Examples 2, 6 and 7 are shown in Table 4.

The sintered body was further processed and bonded to a backing plate, and whether it could be used as a sputtering target to form a film by DC or RF was confirmed. As a result, all the samples could be bonded without any problem and could be used for forming a film by DC/RF.

Comparative Examples 1 to 4

Using the gallium nitride powder shown in Table 1, hot pressing was conducted under the same temperature increasing rate, holding time and temperature decreasing rate conditions as in Example 1 except for the ultimate vacuum, sintering temperature, holding time and pressure as identified in Table 2, whereupon of the obtained gallium nitride-based sintered body, the weight, the density, the oxygen content, the average particle size (D50) and the results of the heating test are as shown in Table 3. In Comparative Example 3, the chip of the sintered body was small, and the deflective strength test could not be conducted.

Further, amounts of impurities in Comparative Example 4 are shown in Table 4.

Examples 8 to 13

600 g in Example 8, or 120 g in Examples 9 to 13 of a gallium nitride powder having an element added in a proportion as identified in Table 1, was cast in a carbon mold with a coefficient of thermal expansion of the die as identified in Table 2, and the mold was put in a hot press. Sintering was started with an ultimate vacuum before the start of temperature increase as identified in Table 2, the temperature was increased at 200° C./h finally to the temperature as identified in Table 2, and on that occasion, the pressure was elevated to the pressure as identified in Table 2 when the maximum temperature was kept, and hot pressing was conducted for a holding time of 2 hours at the maximum temperature under the corresponding pressure. The temperature was decreased to about 50° C., the mold was taken out, and the sintered body was recovered. Of the obtained gallium nitride-based sintered body, the area, the X-ray peak intensity ratio, the density, the oxygen content, the deflective strength and the average particle size (D50) are shown in Table 3.

Further, the amounts of impurities in Example 8 are shown in Table 4.

Comparative Examples 5 to 7

Using the gallium nitride powder as identified in Table 1, hot pressing was conducted under the same conditions as in Example 9 except for the conditions as identified in Table 2, whereupon the area, the X-ray peak intensity ratio, the density, the oxygen content and the deflective strength of the obtained gallium nitride-based sintered body were as identified in Table 3. In Comparative Example 5, no sintered body was obtained and the area could not be measured.

Example 14

To 600 g of a gallium nitride powder as identified in Table 1, metal silicon was added at a predetermined concentration and uniformly mixed, and the mixture was cast in a carbon mold of 180 mm in diameter, and the mold was put in a hot press. Sintering was started with an ultimate vacuum before the start of temperature increase as identified in Table 2, the temperature was increased at 200° C./h finally to the temperature as identified in Table 2, and on that occasion, the pressure was elevated to the pressure as identified in Table 2 when the maximum temperature was kept, and hot pressing was conducted for a holding time of 2 hours at the maximum temperature under the corresponding pressure. The temperature was decreased finally to about 50° C., the mold was taken out, and the sintered body was recovered. The sintered body was at least 150 cm$^2$ in each Example. Of the obtained gallium nitride-based sintered body, the density, the oxygen content, the average particle size (D50) and the dopant content are shown in Table 3.

Further, the amounts of impurities in Example 14 are shown in Table 4.

Examples 15 and 16

To 100 g of a gallium nitride powder as identified in Table 1, silicon nitride was added at a predetermined concentration and uniformly mixed, and the mixture was cast in a carbon mold of 78 mm in diameter, and the mold was put in a hot press. Sintering was started with an ultimate vacuum before the start of temperature increase as identified in Table 2, the temperature was increased at 200° C./h finally to the temperature as identified in Table 2, and on that occasion, the pressure was elevated to the pressure as identified in Table 2 when the maximum temperature was kept, and hot pressing was conducted for a holding time of 2 hours at the maximum temperature under the corresponding pressure. The temperature was decreased finally to about 50° C., the mold was taken out, and the sintered body was recovered. Of the obtained gallium nitride sintered body, the density, the oxygen content, the average particle size (D50) and the dopant content are shown in Table 3.

Examples 17 to 19

Gallium nitride sintered body was prepared under the same conditions as in Example 15 except that the dopant source added was as identified in Table 1. Of the obtained gallium nitride sintered body, the density, the oxygen content, the average particle size (D50) and the dopant content are shown in Table 3.

Further, the amounts of impurities in Example 17 are shown in Table 4.

Example 20

Gallium nitride sintered body was prepared under the same conditions as in Example 15 except that the dopant source added was as identified in Table 1. Of the obtained gallium nitride sintered body, the density, the oxygen content, the average particle size (D50) and the dopant content are shown in Table 3.

Comparative Examples 8 and 9

Gallium nitride was prepared under the same conditions as in Example 15 except that the dopant source was as identified in Table 1. Of the obtained gallium nitride sintered body, the density, the oxygen content, the average particle size (D50) and the dopant content are shown in Table 3. Fracture occurred at the time of sintering, and no desired sintered body was obtained.

Comparative Example 10

Gallium nitride was prepared under the same conditions as in Comparative Example 8 except that the dopant source added was as identified in Table 1. Of the obtained gallium nitride sintered body, the density, the oxygen content, the average particle size (D50) and the dopant content are shown in Table 3. The oxygen content was high, and a sintered body having a quality required for use as a sputtering target was not obtained.

TABLE 1

| | Gallium nitride | | | Additive/dopant source | | | | Average particle size (D50) μm |
|---|---|---|---|---|---|---|---|---|
| Examples | Oxygen content atm % | Untamped density g/cm³ | Average particle size (D50) μm | Element | Amount added | Compound | Oxygen content atm % | |
| Ex. 1 | 0.9 | 1.2 | 0.87 | Nil | | | | |
| Ex. 2 | 0.5 | 1.2 | 2.3 | Nil | | | | |
| Ex. 3 | 0.5 | 1.2 | 2.3 | Nil | | | | |
| Ex. 4 | 0.2 | 1.4 | 9 | Nil | | | | |
| Ex. 5 | 0.2 | 1.4 | 9 | Nil | | | | |
| Ex. 6 | 0.1 | 1.7 | 62 | Nil | | | | |
| Ex. 7 | 0.1 | 1.7 | 62 | Nil | | | | |
| Ex. 8 | 0.5 | 1.2 | 2.3 | Al | 0.0016 atm % | AlN | 1.1 | — |
| Ex. 9 | 0.28 | 1.4 | 29 | Al | 0.028 atm % | AlN | 1.1 | — |
| Ex. 10 | 0.5 | 1.2 | 2.3 | Al | 24.7 atm % | AlN | 1.1 | — |
| Ex. 11 | 0.5 | 1.2 | 2.3 | In | 0.003 atm % | In | <0.1 | — |
| Ex. 12 | 0.5 | 1.2 | 2.3 | B | 0.14 atm % | B | <0.1 | — |
| Ex. 13 | 0.5 | 1.2 | 2.3 | Al | 10 atm % | AlN | 1.1 | — |
| Ex. 14 | 0.5 | 1.2 | 2.3 | Si (Dopant source) | 10 wt ppm | Si | — | 1 |
| Ex. 15 | 0.28 | 1.4 | 29 | Si (Dopant source) | 170 wt ppm | $Si_3N_4$ | — | 1 |
| Ex. 16 | 0.5 | 1.2 | 2.3 | Si (Dopant source) | 17000 wt ppm | $Si_3N_4$ | — | 1 |
| Ex. 17 | 0.5 | 1.2 | 2.3 | Mg (Dopant source) | 14 wt ppm | $Mg_3N_2$ | — | 10 |
| Ex. 18 | 0.2 | 1.4 | 29 | Mg (Dopant source) | 140 wt ppm | $Mg_3N_2$ | — | 10 |
| Ex. 19 | 0.5 | 1.2 | 2.3 | Mg (Dopant source) | 14000 wt ppm | $Mg_3N_2$ | — | 10 |
| Ex. 20 | 0.5 | 1.7 | 2.3 | Zn (Dopant source) | 110 wt ppm | $Zn_3N_2$ | — | 10 |
| Comp. Ex. 1 | 0.5 | 1.2 | 2.3 | Nil | | | | |
| Comp. Ex. 2 | 0.9 | 1.2 | 0.87 | Nil | | | | |
| Comp. Ex. 3 | 0.5 | 1.2 | 2.3 | Nil | | | | |
| Comp. Ex. 4 | 0.9 | 1.2 | 0.87 | Nil | | | | |
| Comp. Ex. 5 | 0.5 | 1.2 | 2.3 | Al | 20 atm % | Al | <0.1 | — |
| Comp. Ex. 6 | 0.5 | 1.2 | 2.3 | Al | 20 atm % | $Al_2O_3$ | 60 | — |
| Comp. Ex. 7 | 0.5 | 1.2 | 2.3 | In | 15 atm % | $In_2O_3$ | 60 | — |
| Comp. Ex. 8 | 0.5 | 1.2 | 2.3 | Si | 200000 wt ppm | Si | — | 1 |

TABLE 1-continued

| | Gallium nitride | | | Additive/dopant source | | | | |
|---|---|---|---|---|---|---|---|---|
| Examples | Oxygen content atm % | Untamped density g/cm³ | Average particle size (D50) μm | Element | Amount added | Compound | Oxygen content atm % | Average particle size (D50) μm |
| Comp. Ex. 9 | 0.5 | 1.2 | 2.3 | Mg | 16000 wt ppm | MgO | — | 10 |
| Comp. Ex. 10 | 0.5 | 1.2 | 2.3 | Si | 22000 wt ppm | $SiO_2$ | — | 1 |

TABLE 2

| | Hot press mold | | | Hot pressing conditions | | | | |
|---|---|---|---|---|---|---|---|---|
| Examples | Diameter of die mmφ | Coefficient of linear thermal expansion $10^{-6}$/K | Number of pieces of sleeve Pieces | Ultimate vacuum Pa | Sintering atmosphere | Sintering temperature °C | Holding time hr | Pressure MPa |
| Ex. 1 | 180 | 5.6 | 4 | 0.004 | Vacuum | 1090 | 2 | 50 |
| Ex. 2 | 180 | 5.6 | 4 | 0.004 | Vacuum | 1090 | 3 | 50 |
| Ex. 3 | 180 | 5.6 | 4 | 0.004 | Vacuum | 1090 | 5 | 50 |
| Ex. 4 | 180 | 5.6 | 4 | 0.004 | Vacuum | 1110 | 2 | 50 |
| Ex. 5 | 180 | 5.6 | 4 | 0.004 | Vacuum | 1110 | 3 | 50 |
| Ex. 6 | 180 | 5.6 | 4 | 0.004 | Vacuum | 1130 | 2 | 50 |
| Ex. 7 | 180 | 5.6 | 4 | 0.003 | Vacuum | 1130 | 4 | 50 |
| Ex. 8 | 180 | 5.6 | 4 | 0.004 | Vacuum | 1090 | 0.75 | 50 |
| Ex. 9 | 78 | 5.6 | 4 | 0.004 | Vacuum | 1110 | 0.75 | 50 |
| Ex. 10 | 78 | 5.6 | 4 | 0.004 | Vacuum | 1090 | 0.75 | 50 |
| Ex. 11 | 78 | 5.6 | 4 | 0.004 | Vacuum | 1090 | 0.5 | 50 |
| Ex. 12 | 78 | 5.6 | 4 | 0.003 | Vacuum | 1110 | 0.5 | 50 |
| Ex. 13 | 78 | 5.6 | 4 | 0.003 | Vacuum | 1090 | 0.75 | 50 |
| Ex. 14 | 180 | 5.6 | 4 | 0.004 | Vacuum | 1090 | 3 | 50 |
| Ex. 15 | 78 | 5.6 | 4 | 0.004 | Vacuum | 1110 | 3 | 50 |
| Ex. 16 | 78 | 5.6 | 4 | 0.004 | Vacuum | 1090 | 3 | 50 |
| Ex. 17 | 78 | 5.6 | 4 | 0.004 | Vacuum | 1090 | 2 | 50 |
| Ex. 18 | 78 | 5.6 | 4 | 0.004 | Vacuum | 1110 | 3 | 50 |
| Ex. 19 | 78 | 5.6 | 4 | 0.004 | Vacuum | 1090 | 2 | 50 |
| Ex. 20 | 78 | 5.6 | 4 | 0.003 | Vacuum | 1110 | 4 | 50 |
| Comp. Ex. 1 | 180 | 0.1 | 2 | 0.02 | Vacuum | 1090 | 1 | 50 |
| Comp. Ex. 2 | 180 | 4.5 | 2 | 0.004 | Vacuum | 1100 | 1 | 50 |
| Comp. Ex. 3 | 77 | 5.6 | No sleeve | 0.005 | Vacuum | 1100 | 1 | 50 |
| Comp. Ex. 4 | 180 | 0.1 | 2 | 0.02 | Vacuum | 1060 | 1 | 50 |
| Comp. Ex. 5 | 78 | 5.6 | 2 | 0.02 | Vacuum | 1130 | 3 | 50 |
| Comp. Ex. 6 | 78 | 5.6 | 2 | 0.005 | Vacuum | 1100 | 1 | 50 |
| Comp. Ex. 7 | 78 | 5.6 | 2 | 0.004 | Vacuum | 1100 | 1 | 50 |
| Comp. Ex. 8 | 78 | 5.6 | 2 | 0.02 | Vacuum | 1090 | 1 | 50 |
| Comp. Ex. 9 | 78 | 5.6 | 2 | 0.005 | Vacuum | 1100 | 1 | 50 |
| Comp. Ex. 10 | 78 | 5.6 | 2 | 0.004 | Vacuum | 1100 | 1 | 50 |

TABLE 3

| Examples | Content of additives (Al, In, B)/dopant | | | | |
|---|---|---|---|---|---|
| | Al atm % | In atm % | B atm % | Si wt ppm | Mg + Zn wt ppm |
| Ex. 1 | — | — | — | — | — |
| Ex. 2 | — | — | — | — | — |
| Ex. 3 | — | — | — | — | — |
| Ex. 4 | — | — | — | — | — |
| Ex. 5 | — | — | — | — | — |
| Ex. 6 | — | — | — | — | — |
| Ex. 7 | — | — | — | — | — |
| Ex. 8 | 0.0016 atm % | — | — | — | — |
| Ex. 9 | 0.028 atm % | — | — | — | — |
| Ex. 10 | 24.5 atm % | — | — | — | — |
| Ex. 11 | — | 0.003 atm % | — | — | — |
| Ex. 12 | — | — | 0.15 atm % | — | — |
| Ex. 13 | 9.8 atm % | — | — | — | — |
| Ex. 14 | — | — | — | 12 wt ppm | — |
| Ex. 15 | — | — | — | 110 wt ppm | — |
| Ex. 16 | — | — | — | 10800 wt ppm | — |
| Ex. 17 | — | — | — | — | 12 wt ppm |
| Ex. 18 | — | — | — | — | 110 wt ppm |
| Ex. 19 | — | — | — | — | 10800 wt ppm |
| Ex. 20 | — | — | — | — | 100 wt ppm |
| Comp. Ex. 1 | — | — | — | — | — |
| Comp. Ex. 2 | — | — | — | — | — |
| Comp. Ex. 3 | — | — | — | — | — |
| Comp. Ex. 4 | — | — | — | — | — |
| Comp. Ex. 5 | — | — | — | — | — |
| Comp. Ex. 6 | 20 atm % | — | — | — | — |
| Comp. Ex. 7 | — | 15 atm % | — | — | — |
| Comp. Ex. 8 | — | — | — | — | — |
| Comp. Ex. 9 | — | — | — | — | 10000 wt ppm |
| Comp. Ex. 10 | — | — | — | 12000 wt ppm | — |

| Examples | Physical properties of sintered body | | | | | | |
|---|---|---|---|---|---|---|---|
| | Density g/cm³ | Average particle size (D50) μm | Oxygen content atm % | Deflective strength MPa | Area cm² | X-ray peak intensity ratio % | Fracture |
| Ex. 1 | 4.2 | 1.0 | 0.9 | 53 | 254 | — | Nil |
| Ex. 2 | 4.2 | 2.3 | 0.5 | 55 | 255 | — | Nil |
| Ex. 3 | 4.5 | 2.3 | 0.3 | 62 | 255 | — | Nil |
| Ex. 4 | 4.5 | 9.5 | 0.2 | 60 | 255 | — | Nil |
| Ex. 5 | 4.5 | 9.5 | 0.16 | 55 | 255 | — | Nil |
| Ex. 6 | 4.5 | 62 | 0.1 | 53 | 255 | — | Nil |
| Ex. 7 | 4.8 | 62 | 0.07 | 70 | 255 | — | Nil |
| Ex. 8 | 4.2 | 2 | 0.3 | 60 | 252 | 0 | Nil |
| Ex. 9 | 4.7 | 25 | 0.25 | 52 | 47 | 5 | Nil |
| Ex. 10 | 3.6 | 2.1 | 0.92 | — | 47 | 0 | Nil |
| Ex. 11 | 4.2 | 2.1 | 0.28 | — | 47 | 0 | Nil |
| Ex. 12 | 4.8 | 1.8 | 0.4 | — | 47 | 2 | Nil |
| Ex. 13 | — | 2 | 0.75 | — | 47 | 0 | Nil |
| Ex. 14 | 4.2 | 2.2 | 0.26 | 65 | — | — | Nil |
| Ex. 15 | 4.7 | 26 | 0.2 | 61 | — | — | Nil |
| Ex. 16 | 4.2 | 2.1 | 0.26 | — | — | — | Nil |
| Ex. 17 | 4.2 | 2.1 | 0.26 | 51 | — | — | Nil |
| Ex. 18 | 4.6 | 25 | 0.2 | — | — | — | Nil |
| Ex. 19 | 4.2 | 2.1 | 0.26 | — | — | — | Nil |
| Ex. 20 | 4.8 | 1.6 | 0.4 | — | — | — | Nil |
| Comp. Ex. 1 | — | 2.3 | 0.6 | 18 | 74 | — | Fractured |
| Comp. Ex. 2 | — | 1 | 1.1 | 25 | 110 | — | Fractured |
| Comp. Ex. 3 | 4.2 | 2.3 | 1.3 | — | 16 | — | Fractured |

TABLE 3-continued

| | | | | | | | |
|---|---|---|---|---|---|---|---|
| Comp. Ex. 4 | — | 1 | 1.2 | — | 70 | — | Fractured |
| Comp. Ex. 5 | — | — | — | — | — | — | Fractured |
| Comp. Ex. 6 | 3.7 | 2.2 | 30 | 26 | 14 | 12 | Fractured |
| Comp. Ex. 7 | 4.3 | 2.2 | 21 | — | 12 | 15 | Fractured |
| Comp. Ex. 8 | — | — | — | — | — | — | Fractured |
| Comp. Ex. 9 | 4 | — | 4.1 | — | — | — | Fractured |
| Comp. Ex. 10 | 4 | — | 6.8 | — | — | — | Nil |

TABLE 4

| | | Content | | | | | | |
|---|---|---|---|---|---|---|---|---|
| Element | Unit | Ex. 2 | Ex. 6 | Ex. 7 | Ex. 8 | Ex. 14 | Ex. 17 | Comp. Ex. 4 |
| Si | wt ppm | 1.7 | 0.83 | 0.08 | 1.7 | — | 0.61 | 32 |
| Ge | wt ppm | <0.01 | <0.01 | <0.01 | <0.01 | <0.01 | <0.01 | <0.01 |
| Sn | wt ppm | <0.005 | <0.005 | <0.005 | <0.005 | <0.005 | <0.005 | <0.005 |
| Pb | wt ppm | <0.005 | <0.005 | <0.005 | <0.005 | <0.005 | <0.005 | <0.005 |
| Mg | wt ppm | 0.18 | 0.17 | 0.11 | 0.18 | 0.22 | — | 0.47 |
| Ca | wt ppm | 1.2 | 0.39 | 0.24 | 1.2 | 0.12 | 0.27 | 1.8 |
| Sr | wt ppm | <0.005 | <0.005 | <0.005 | <0.005 | <0.005 | <0.005 | <0.005 |
| Ba | wt ppm | <0.005 | <0.005 | <0.005 | <0.005 | <0.005 | <0.005 | <0.005 |
| Zn | wt ppm | <0.005 | 0.47 | <0.005 | <0.005 | <0.005 | 0.22 | 0.92 |
| Cd | wt ppm | <0.005 | <0.005 | <0.005 | <0.005 | <0.005 | <0.005 | <0.005 |

REFERENCE SYMBOLS

1: Sleeve
2: Die
3: Upper punch
4: Lower punch

The present invention was described in detail with reference to specific embodiments, however, it is obvious for the person skilled in the art that various changes and modifications are possible without departing from the intension and the scope of the present invention.

The entire disclosures of Japanese Patent Application No. 2018-191481 filed on Oct. 10, 2018, Japanese Patent Application No. 2018-201609 filed on Oct. 26, 2018 and Japanese Patent Application No. 2018-213668 filed on Nov. 14, 2018 including specifications, claims and summaries are incorporated herein by reference in their entireties.

The invention claimed is:

1. A gallium nitride-based sintered body, wherein the gallium nitride-based sintered body has an oxygen content of 1 atm % or less and an average particle size (D50) of from 5 μm to 150 μm, and
   wherein the gallium nitride-based sintered body has a deflective strength of at least 50 MPa.

2. The gallium nitride-based sintered body according to claim 1, wherein the gallium nitride-based sintered body comprises elements Si, Ge, Sn, Pb, Be, Mg, Ca, Sr, Ba, Zn and Cd as impurities in a total amount of less than 10 wt ppm.

3. The gallium nitride-based sintered body according to claim 1, wherein the gallium nitride-based sintered body comprises Mg and Si as impurities in a total amount of less than 5 wt ppm.

4. The gallium nitride-based sintered body according to claim 2, wherein the gallium nitride-based sintered body comprises Si as an impurity in an amount of less than 1 wt ppm.

5. The gallium nitride-based sintered body according to claim 1, wherein the gallium nitride-based sintered body has a content of at least one Group 13 element selected from the group consisting of boron, aluminum and indium of from 0.001 atm % to 25 atm %.

6. The gallium nitride-based sintered body according to claim 5, wherein the gallium nitride-based sintered body comprises elements Si, Ge, Sn, Pb, Be, Mg, Ca, Sr, Ba, Zn and Cd as impurities in a total amount of less than 10 wt ppm.

7. The gallium nitride-based sintered body according to claim 5, wherein the gallium nitride-based sintered body comprises Mg and Si as impurities in a total amount of less than 5 wt ppm.

8. The gallium nitride-based sintered body according to claim 5, wherein the gallium nitride-based sintered body comprises Si as an impurity in an amount of less than 1 wt ppm.

9. The gallium nitride-based sintered body according to claim 5, wherein in an X-ray diffraction spectrum of the gallium nitride-based sintered body, the maximum value of the peak attributable to gallium metal is 10% or less of the maximum value of the peak attributable to gallium nitride.

10. The gallium nitride-based sintered body according to claim 1, wherein the gallium nitride-based sintered body has a content of at least one dopant selected from the group consisting of Si, Ge, Sn, Pb, Be, Mg, Ca, Sr, Ba, Zn and Cd of from 1 wt ppm to 100,000 wt ppm.

11. The gallium nitride-based sintered body according to claim 10, wherein the dopant is at least one member selected from the group consisting of Si, Ge, Sn, Pb and Be.

12. The gallium nitride-based sintered body according to claim 10, wherein the dopant is at least one member selected from the group consisting of Mg, Ca, Sr, Ba, Zn and Cd.

13. The gallium nitride-based sintered body according to claim 2, wherein the area of the gallium nitride-based sintered body is at least 150 cm$^2$.

14. The gallium nitride-based sintered body according to claim 2, wherein the gallium nitride-based sintered body has a density of from 3.0 g/cm$^3$ to 5.4 g/cm$^3$.

15. A method for producing the gallium nitride-based sintered body of claim 2, comprising:

hot pressing a raw material comprising a gallium nitride powder having an oxygen content of 1 atm % or less, wherein a difference between a coefficient of linear thermal expansion in a direction perpendicular to the pressurization direction of a hot press mold and a coefficient of linear expansion of the raw material is 15% or less.

16. A method for producing the gallium nitride-based sintered body of claim 5, comprising:

hot pressing raw materials comprising a gallium nitride powder having an oxygen content of 1 atm % or less and a powder of at least one Group 13 element selected from the group consisting of boron, aluminum and indium, wherein a difference between a coefficient of linear thermal expansion in a direction perpendicular to the pressurization direction of a hot press mold and a coefficient of linear expansion of the raw material is 15% or less.

17. A method for producing the gallium nitride-based sintered body of claim 10, comprising:

hot pressing raw materials comprising a gallium nitride powder having an oxygen content of 1 atm % or less and a dopant source, wherein a difference between a coefficient of linear thermal expansion in a direction perpendicular to the pressurization direction of a hot press mold and a coefficient of linear expansion of the raw material is 15% or less.

18. The method for producing the gallium nitride-based sintered body according to claim 15, wherein the hot press mold is designed to obtain a disk, and a sleeve divided into three or more pieces is used.

19. A sputtering target, comprising:
the gallium nitride-based sintered body of claim 2.

20. The sputtering target according to claim 19, wherein no layer containing tungsten is present between a target member and a bonding layer.

21. A method for producing a gallium nitride-based thin film, comprising:
forming a gallium nitride-based thin film using the sputtering target of claim 19.

22. A sputtering target, comprising:
the gallium nitride-based sintered body of claim 5.

23. A sputtering target, comprising:
the gallium nitride-based sintered body of claim 10.

24. A method for producing a gallium nitride-based thin film, comprising:
forming a gallium nitride-based thin film using the sputtering target of claim 22.

25. A method for producing a gallium nitride-based thin film, comprising:
forming a gallium nitride-based thin film using the sputtering target of claim 23.

* * * * *